(12) United States Patent
Hamada et al.

(10) Patent No.: US 8,318,392 B2
(45) Date of Patent: Nov. 27, 2012

(54) ALIGNMENT METHOD AND METHOD FOR MANUFACTURING FLAT PANEL DISPLAY

(75) Inventors: Ryota Hamada, Osaka (JP); Tomohiro Murakoso, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/259,246

(22) PCT Filed: Feb. 28, 2011

(86) PCT No.: PCT/JP2011/001132
§ 371 (c)(1),
(2), (4) Date: Sep. 23, 2011

(87) PCT Pub. No.: WO2011/111327
PCT Pub. Date: Sep. 15, 2011

(65) Prior Publication Data
US 2012/0015289 A1    Jan. 19, 2012

(30) Foreign Application Priority Data

Mar. 12, 2010   (JP) .................................. 2010-055728

(51) Int. Cl.
*G03F 9/00*   (2006.01)
(52) U.S. Cl. ............ 430/22; 430/30; 430/319; 430/394; 430/396
(58) Field of Classification Search .................... 430/22, 430/30, 319, 394, 396
See application file for complete search history.

(56) References Cited

U.S. PATENT DOCUMENTS

| 4,344,160 A | 8/1982 | Gabriel et al. |
| 2009/0212703 A1 | 8/2009 | Suzuki et al. |

FOREIGN PATENT DOCUMENTS

| JP | 58-30128 | 2/1983 |
| JP | 62-279629 | 12/1987 |
| JP | 01-250891 | 10/1989 |
| JP | 3-70365 | 11/1991 |
| JP | 2000-035676 | 2/2000 |
| JP | 2007-171451 | 7/2007 |
| JP | 2007-179777 | 7/2007 |

OTHER PUBLICATIONS

International Search Report of PCT Application No. PCT/JP2011/001132, mailed on May 17, 2011.

*Primary Examiner* — Christopher Young
(74) *Attorney, Agent, or Firm* — Panasonic Patent Center

(57) ABSTRACT

An alignment method is disclosed, in which a distance between a substrate and a photomask is set at a predetermined exposure gap. The photomask is rectangular, and includes a first side, and a second side opposite to the first side. A distance between a midpoint of the first side and the substrate is matched with the exposure gap. The photomask is rotated about, as an axis, a line that connects the midpoint of the first side and a midpoint of the second side to each other, whereby distances between both ends of the first side and the substrate are individually matched with the exposure gap. The photomask is rotated about the first side taken as an axis, whereby a distance between the midpoint of the second side and the substrate is matched with the exposure gap.

6 Claims, 5 Drawing Sheets

ALIGNMENT METHOD AND METHOD FOR MANUFACTURING FLAT PANEL DISPLAY

TECHNICAL FIELD

A technology described herein relates to an alignment method between an exposure target substrate and a photomask in lithography and to a method for manufacturing a flat panel display, in which a pattern is formed by the lithography.

BACKGROUND ART

A flat panel display (hereinafter, referred to as an FPD) represented by a plasma display panel (hereinafter, referred to as a PDP) includes components such as patterned electrodes and the like in an inside of a panel surface. It is known to use a lithography method for patterning the electrodes. That is, there is known a method of exposing, through a photomask, a material formed on a substrate, followed by development, thereby forming a predetermined pattern on the substrate. As a size of a screen of the FPD is increased, it is becoming difficult to form a larger photomask corresponding to a larger screen. In this connection, an exposure method is disclosed, in which a region to be exposed in the inside of the FPD surface is divided into a plurality of regions (for example, refer to Patent Document 1).

PRIOR ART DOCUMENT

Patent Document

Patent Document 1: Unexamined Japanese Patent Publication No. 2007-179777

SUMMARY OF THE INVENTION

An alignment method is described, in which a distance between a substrate and a photomask is set at a predetermined exposure gap. The photomask is rectangular, and includes a first side, and a second side opposite to the first side. A distance between a midpoint of the first side and the substrate is matched with the exposure gap. The photomask is rotated about, as an axis, a line that connects the midpoint of the first side and a midpoint of the second side to each other, whereby distances between both ends of the first side and the substrate are individually matched with the exposure gap. The photomask is rotated about the first side taken as an axis, whereby a distance between the midpoint of the second side and the substrate is matched with the exposure gap.

A method for producing a flat panel display is described, in which a photosensitive film formed on a substrate is subjected to division exposure by using a plurality of photomasks disposed above the photosensitive film while interposing an exposure gap therebetween. The plurality of photomasks at least includes a first photomask and a second photomask. The first photomask is rectangular, and includes a first side, and a second side opposite to the first side. The second photomask is rectangular, and includes a third side, and a fourth side opposite to the third side. A distance between a midpoint of the first side and the substrate is matched with the exposure gap in a boundary portion subjected to the division exposure. The first photomask is rotated about, as an axis, a line that connects the midpoint of the first side and a midpoint of the second side to each other, whereby distances between both ends of the first side and the substrate are matched individually with the exposure gap. The first photomask is rotated about the first side taken as an axis, whereby a distance between the midpoint of the second side and the substrate is matched with the exposure gap. A distance between a midpoint of the third side and the substrate is matched with the exposure gap in a boundary portion subjected to the division exposure. The second photomask is rotated about, as an axis, a line that connects the midpoint of the third side and a midpoint of the fourth side to each other, whereby distances between both ends of the third side and the substrate are matched individually with the exposure gap. The second photomask is rotated about the third side taken as an axis, whereby a distance between the midpoint of the fourth side and the substrate is matched with the exposure gap.

DESCRIPTION OF EMBODIMENTS

A description is made of preferred embodiments of the present invention by taking as an example a method for manufacturing a PDP.

1. Structure of PDP 1

Figure 1:
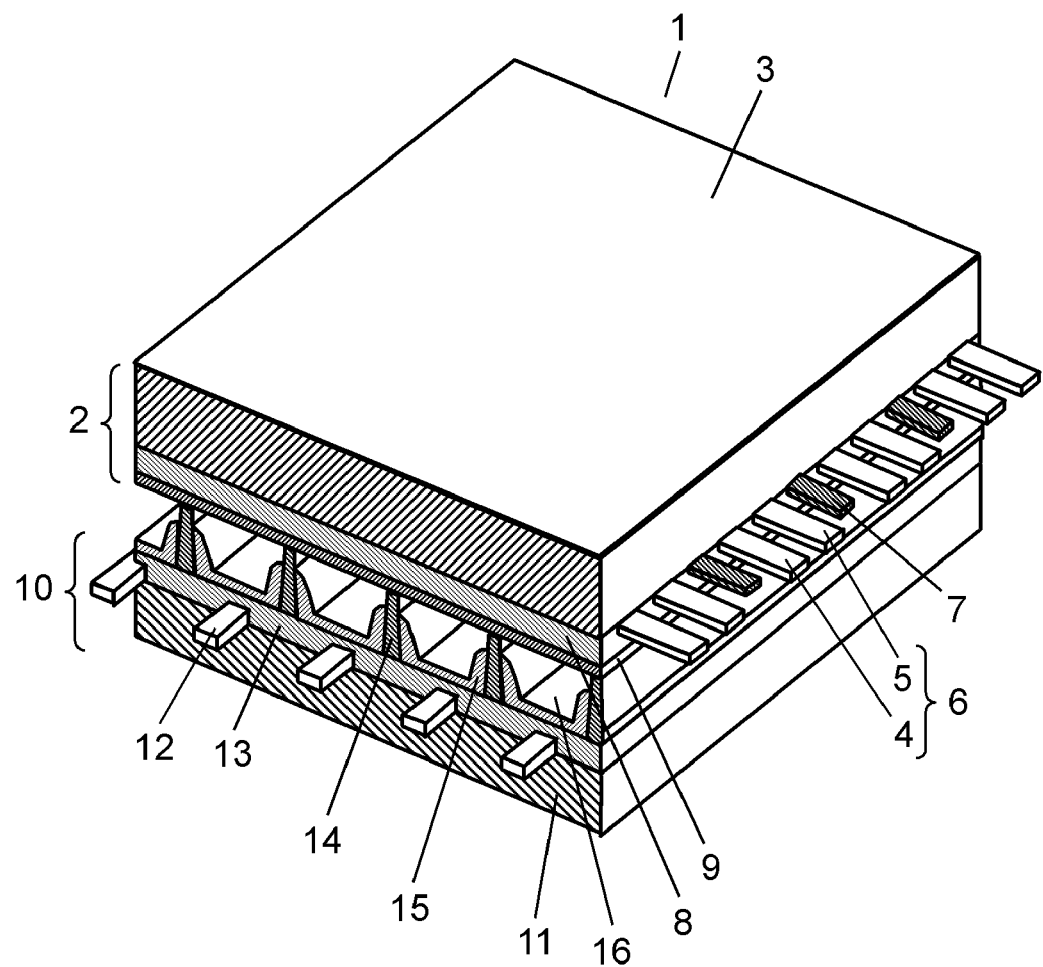
FIG. 1 is a perspective view showing main portions of a PDP.

In terms of a basic structure, the PDP is a general AC surface discharge-type PDP. As shown in FIG. 1, PDP 1 is provided in such a manner that front plate 2 including front glass substrate 3 and rear plate 10 including rear glass substrate 11 are arranged opposite to each other. Peripheral edges of front plate 2 and rear plate 10 are hermetically sealed by a sealing material such as glass frit. In discharge space 16 in an inside of PDP 1 thus sealed, discharge gas of neon (Ne), xenon (Xe) or the like is sealed with a pressure of 53 kPa (400 Torr) to 80 kPa (600 Torr).

In each of scan electrodes 4 and sustain electrodes 5, a bus electrode made of Ag is stacked on a transparent electrode made of conductive metal oxide such as indium tin oxide (ITO), tin oxide ($SnO_2$) and zinc oxide (ZnO).

On rear glass substrate 11, a plurality of data electrodes 12 made of a conductive material containing silver (Ag) as a main component is arranged in parallel to one another in a direction perpendicular to display electrodes 6. Data electrodes 12 are coated with base dielectric layer 13. Moreover, on base dielectric layer 13 between data electrodes 12, barrier ribs 14 with a predetermined height, which partition discharge space 16, are formed. On trenches between barrier ribs 14, for each of data electrodes 12, there are sequentially applied and formed: phosphor layer 15 that emits red light by an ultraviolet ray; phosphor layer 15 that emits green light thereby; and phosphor layer 15 that emits blue light thereby. At positions where display electrodes 6 and data electrodes 12 intersect each other, discharge cells are formed. The discharge cells having red, green and blue phosphor layers 15 arrayed in a direction of display electrodes 6 constitute pixels for color display.

Note that, in this embodiment, the discharge gas sealed in discharge space 16 contains 10% by volume to 30% by volume of Xe.

On front glass substrate 3 manufactured by a float method or the like, display electrodes 6 composed of scan electrodes 4 and sustain electrodes 5 and light shielding layer 7 are formed. Scan electrodes 4 and sustain electrodes 5 are composed of: transparent electrodes and made of indium tin oxide (ITO), tin oxide (SnO2); and metal bus electrodes and formed on transparent electrodes and, respectively. Metal bus electrodes and are formed of a conductive material containing silver (Ag) as a main component.

Dielectric layer 8 is composed of at least two layers, which are: first dielectric layer that covers display electrodes 6 and light shielding layer 7; and second dielectric layer that covers first dielectric layer. Moreover, front plate 2 includes protective layer 9 that covers second dielectric layer.

Furthermore, protective layer 9 is formed on a surface of dielectric layer 8. Protective layer 9 includes: base layer; and agglomerated particles in which a plurality of crystal particles of metal oxide is agglomerated together.

2. Method for Manufacturing PDP 1

2-1. Formation of Front Plate 2

By a photolithography method, scan electrodes 4, sustain electrodes 5 and black stripes 7 are formed on front glass substrate 3. Scan electrodes 4 and sustain electrodes 5 have metal bus electrodes 4b and 5b containing silver (Ag) for ensuring conductivity. Moreover, scan electrodes 4 and sustain electrodes 5 have transparent electrodes 4a and 5a. Metal bus electrodes 4b are stacked on transparent electrodes 4a. Metal bus electrodes 5b are stacked on transparent electrodes 5a.

As a material of transparent electrodes 4a and 5a, indium tin oxide (ITO) or the like is used in order to ensure transparency and electrical conductivity. First, by a sputtering method or the like, an ITO thin film is formed on front glass substrate 3. Next, by the lithography method, transparent electrodes 4a and 5a with predetermined patterns are formed.

As a material of metal bus electrodes 4b and 5b, electrode paste is used, which contains silver (Ag), glass frit for binding the silver, photosensitive resin, a solvent and the like. First, by a screen printing method and the like, the electrode paste is applied on front glass substrate 3. Next, the solvent in the electrode paste is removed by a baking oven. Next, the electrode paste is exposed through a photomask with a predetermined pattern.

Next, the electrode paste is developed, and a pattern of the metal bus electrodes is formed. Finally, by a baking oven, such a metal bus electrode pattern is fired at a predetermined temperature. That is, the photosensitive resin in the metal bus electrode pattern is removed. Moreover, the glass frit in the metal bus electrode pattern is fused. After being fired, the fused glass frit is vitrified. By the steps described above, metal bus electrodes 4b and 5b are formed.

Black stripes 7 are formed of a material containing black pigment. Next, dielectric layer 8 is formed. As a material of dielectric layer 8, dielectric paste that contains dielectric glass frit, resin, a solvent and the like is used. First, by a die coating method, the dielectric paste is applied with a predetermined thickness on front glass substrate 3 so as to cover scan electrodes 4, sustain electrodes 5 and black stripes 7. Next, by the baking oven, the solvent in the dielectric paste is removed. Finally, by the baking oven, the dielectric paste is fired at a predetermined temperature. That is, the resin in the dielectric paste is removed. Moreover, the dielectric glass frit is fused. After being fired, the fused dielectric glass frit is vitrified. By the steps described above, dielectric layer 8 is formed. Here, the screen printing method, a spin coating method and the like can also be used as well as the method of performing the die coating for the dielectric paste. Moreover, a film to serve as dielectric layer 8 can also be formed by a chemical vapor deposition (CVD) method and the like without using the dielectric paste.

Next, protective layer 9 is formed on dielectric layer 8. Protective layer 9 is formed by an electron beam (EB) evaporation device as an example. A material of protective layer 9 is pellets made of single-crystal MgO. Aluminum (Al), silicon (Si) or the like may be further added as impurities to the pellets.

First, the pellets arranged on a deposition chamber of the EB evaporation device are irradiated with an electron beam. The pellets having received energy of the electron beam are volatilized. The volatilized MgO adheres to dielectric layer 8 arranged in the deposition chamber. A film thickness of MgO is adjusted to stay within a predetermined range depending on intensity of the electron beam, a pressure of the deposition chamber and the like.

Note that, as protective layer 9, besides MgO, there can also be used a mixed film thereof with calcium oxide (CaO), a film containing metal oxide such as strontium oxide (SrO), barium oxide (BaO) and aluminum oxide ($Al_2O_3$). Moreover, a film containing plural types of metal oxides can also be used.

By the steps described above, front plate 2 having predetermined constituent members on front glass substrate 3 is completed.

2-2. Formation of Rear Plate 10

By the photolithography method, data electrodes 12 are formed on rear glass substrate 11. As a material of data electrodes 12, data electrode paste is used, which contains silver (Ag) for ensuring conductivity, glass frit for binding the silver, photosensitive resin, a solvent and the like. First, by the screen printing method and the like, the data electrode paste is applied with a predetermined thickness on the rear glass substrate 11. Next, by the baking oven, the solvent in the data electrode paste is removed. Next, the data electrode paste is exposed through a photomask with a predetermined pattern. Next, the data electrode paste is developed, and a data electrode pattern is formed. Finally, by the baking oven, the data electrode pattern is fired at a predetermined temperature. That is, the photosensitive resin in the data electrode pattern is removed. Moreover, the glass frit in the data electrode pattern is fused. After being fired, the fused glass frit is vitrified. By the steps described above, data electrodes 12 are formed. Here, the sputtering method, the evaporation method and the like can also be used as well as the method of performing the screen printing for the data electrode paste.

Next, base dielectric layer 13 is formed. As a material of base dielectric layer 13, base dielectric paste is used, which contains dielectric glass frit, resin, a solvent and the like. First, by the screen printing method and the like, the base dielectric paste is applied on rear glass substrate 11, on which data electrodes 12 are formed with a predetermined thickness, so as to cover data electrodes 12. Next, the solvent in the base dielectric paste is removed by the baking oven. Finally, the base dielectric paste is fired at a predetermined temperature by the baking oven. That is, the resin in the base dielectric paste is removed. Moreover, the dielectric glass frit is fused. After being fired, the fused dielectric glass frit is vitrified. By the steps described above, base dielectric layer 13 is formed.

Here, the die coating method, the spin coating method and the like can be used as well as the method of performing the screen printing for the base dielectric paste. Moreover, a film to serve as base dielectric layer 13 can also be formed by the chemical vapor deposition (CVD) method and the like without using the base dielectric paste.

Next, barrier ribs 14 are formed by the photolithography method. As a material of barrier ribs 14, barrier rib paste is used, which contains a filler, glass frit for binding the filler, photosensitive resin, a solvent and the like. First, by the die coating method and the like, the barrier rib paste is applied with a predetermined thickness on the base dielectric layer 13. Next, by the baking oven, the solvent in the barrier rib paste is removed. Next, the barrier rib paste is exposed through a photomask with a predetermined pattern. Next, the barrier rib paste is developed, and a barrier rib pattern is formed. Finally, by the baking oven, the barrier rib pattern is fired at a predetermined temperature. That is, the photosensitive resin in the barrier rib pattern is removed. Moreover, the glass frit in the barrier rib pattern is fused. After being fired, the fused glass frit is vitrified. By the steps described above, barrier ribs 14 are formed. Here, a sand-blasting method and the like can be used as well as the photolithography method.

Next, phosphor layers 15 are formed. As a material of phosphor layers 15, phosphor paste that contains phosphor particles, a binder, a solvent and the like is used. First, by a dispensing method and the like, the phosphor paste is applied with a predetermined thickness on base dielectric layer 13 between adjacent barrier ribs 14 and on side surfaces of barrier ribs 14. Next, by the baking oven, the solvent in the phosphor paste is removed. Finally, by the baking oven, the phosphor paste is fired at a predetermined temperature. That is, the resin in the phosphor paste is removed. By the steps described above, phosphor layer 15 is formed. Here, the screen printing method and the like can be used as well as the dispensing method.

By the steps described above, rear plate 10 having predetermined constituent members on rear glass substrate 11 is completed.

2-3. Assembly of Front Plate 2 and Rear Plate 10

Next, front plate 2 and rear plate 10 are assembled with each other. First, by the dispensing method, a sealing material (not shown) is formed on the periphery of rear plate 10. As the sealing material (not shown), sealing paste is used, which contains glass frit, a binder, a solvent and the like. Next, by the baking oven, the solvent in the sealing paste is removed. Next, front plate 2 and rear plate 10 are arranged opposite to each other so that display electrodes 6 and data electrodes 12 can intersect each other perpendicularly. Next, peripheries of front plate 2 and rear plate 10 are sealed by glass frit. Finally, the discharge gas containing Ne, Xe or the like is sealed into discharge spaces 16, whereby PDP 1 is completed.

3. Details of Lithography Method

At the time of the exposure, alignment between the photomask and the exposure target substrate is performed. In the case where a shift occurs in the alignment, it becomes impossible to form the patterns as designed. Therefore, an image display state is changed in the inside of the PDP surface, and there occurs unevenness in exterior appearance. Hence, extremely high accuracy is required for the alignment. Moreover, as a size of the screen of the PDP is increased, a division exposure method using a plurality of photomasks is adopted in order to expose a wide region that does not stay within an exposure region of one photomask.

In the division exposure method, there is an overlap region where one division exposure region and other division exposure region are coupled to each other (hereinafter, the overlap region is referred to as a connection region). Hence, it also becomes necessary to perform alignment between the one division exposure region and the other division exposure region. For example, in the case where such a shift as a step occurs in the connection region of the electrode patterns, a step occurs in a specific region in an electrode that should originally have a linear shape. The step continues in a direction normal to a longitudinal direction of the electrode, resulting in unevenness in a stripe shape on exterior appearance.

It is an object of the technology disclosed herein to solve such a problem as described above.

3-1. Details of Division Exposure Method

Figure 2:
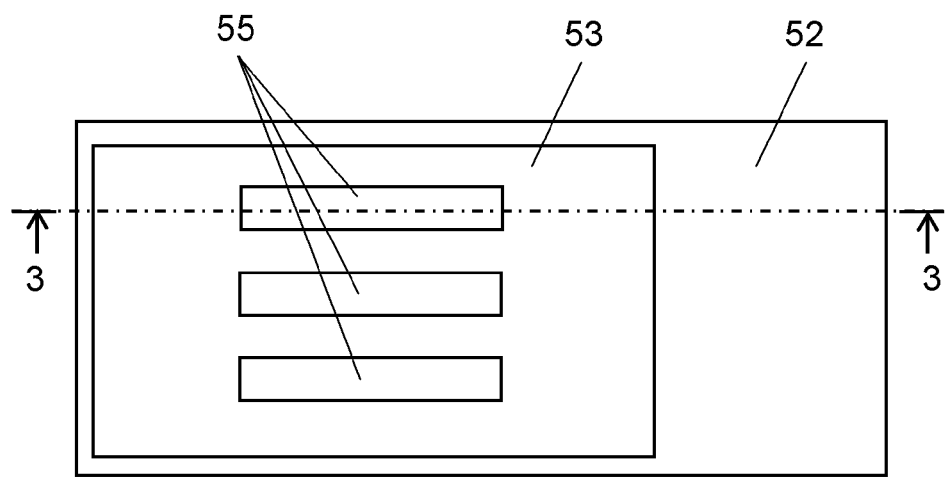
FIG. 2 is a view showing a state of exposing a left region of a substrate in division exposure in this embodiment.
Figure 4:
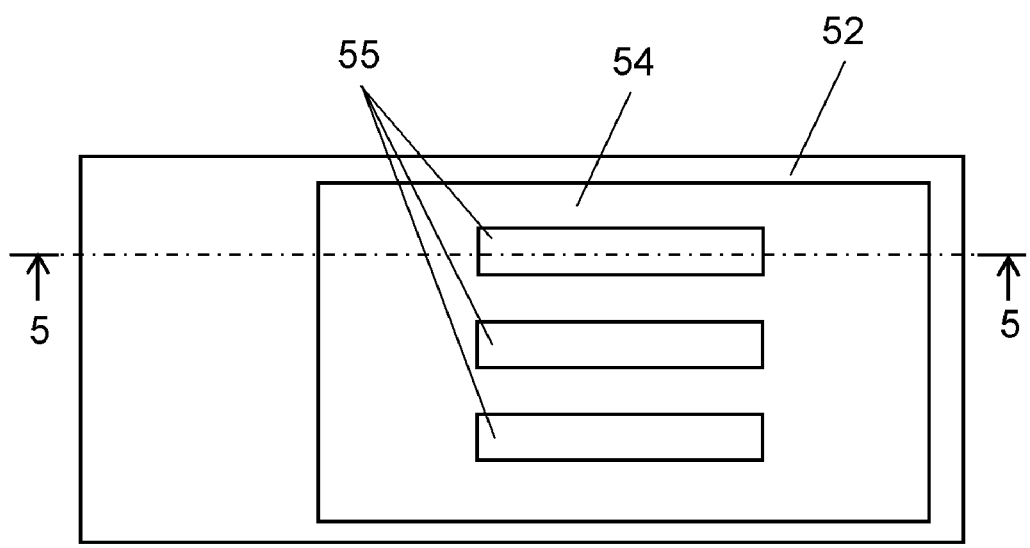
FIG. 4 is a view showing a state of exposing a right region of the substrate in the division exposure in this embodiment.

As shown in FIG. 2 and FIG. 4, photosensitive material layer 52 is formed on rectangular substrate 51. At positions opposite to substrate 51, first photomask 53 and second photomask 54 are arranged. First photomask 53 and second photomask 54 are rectangular. Note that such a term "rectangular" does not always mean that the photomasks have a geometrically perfect rectangular shape. Even if each of the photomasks partially has a projection, a recess and the like owing to the reason in design thereof, the photomask is determined to have a substantially rectangular shape by visual observation.

Figure 3:
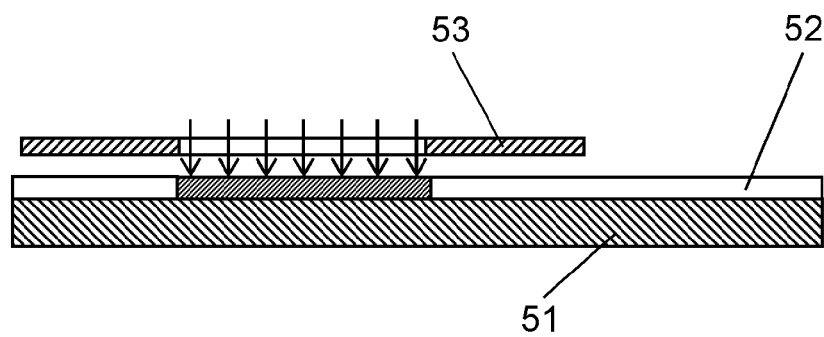
FIG. 3 is a cross-sectional view taken along line 3-3 in FIG. 2.

Here, substrate 51 is larger in area than first photomask 53 and second photomask 54. Hence, photosensitive material layer 52 is subjected to division exposure. That is, photosensitive material layer 52 is divided into a region to be exposed by first photomask 53 and a region to be exposed by second photomask 54. As shown in FIG. 3, on a left side of substrate 51, first photomask 53 is arranged above photosensitive material layer 52 while interposing an exposure gap therebetween. As shown in FIG. 2 and FIG. 4, opening portions 55 are provided in first photomask 53 and second photomask 54.

Figure 5:
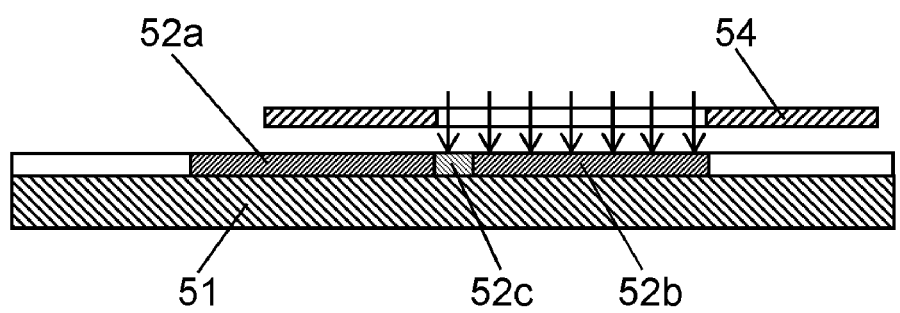
FIG. 5 is a cross-sectional view taken along line 5-5 in FIG. 4.

Photosensitive material layer 52 is irradiated with light through opening portions 55 from an exposure light source (not shown) provided above first photomask 53 and second photomask 54. By first photomask 53, first exposure region 52a on the left side is formed. As shown in FIG. 5, by second photomask 54, second exposure region 52b on the right side is formed. Connection region 52c is formed between first exposure region 52a and second exposure region 52b. Note that, in this embodiment, an unexposed region of photosensitive material layer 52 is removed in the next development step.

Moreover, on upper and lower end portions and a center portion on long sides of substrate 51, cross-shaped alignment marks (not shown) are individually provided. By using the alignment marks, the alignment between substrate 51 and first and second photomasks 53 and 54 can be performed. In the case where the division exposure method is applied to the manufacture of the PDP, then as an example, alignment marks of front plate 2 can be formed of ITO simultaneously when transparent electrodes 4 and 5 are formed on front glass substrate 3. Moreover, alignment marks of rear plate 10 can be formed of a conductive material such as Ag simultaneously when data electrodes 12 are formed on rear glass substrate 11.

3-2. Alignment Method

The alignment is performed by performing correction for relative positions between substrate 51 and first and second photomasks 53 and 54. The correction is performed by position correction and inclination correction.

3-2-1. Position Correction

Figure 6:
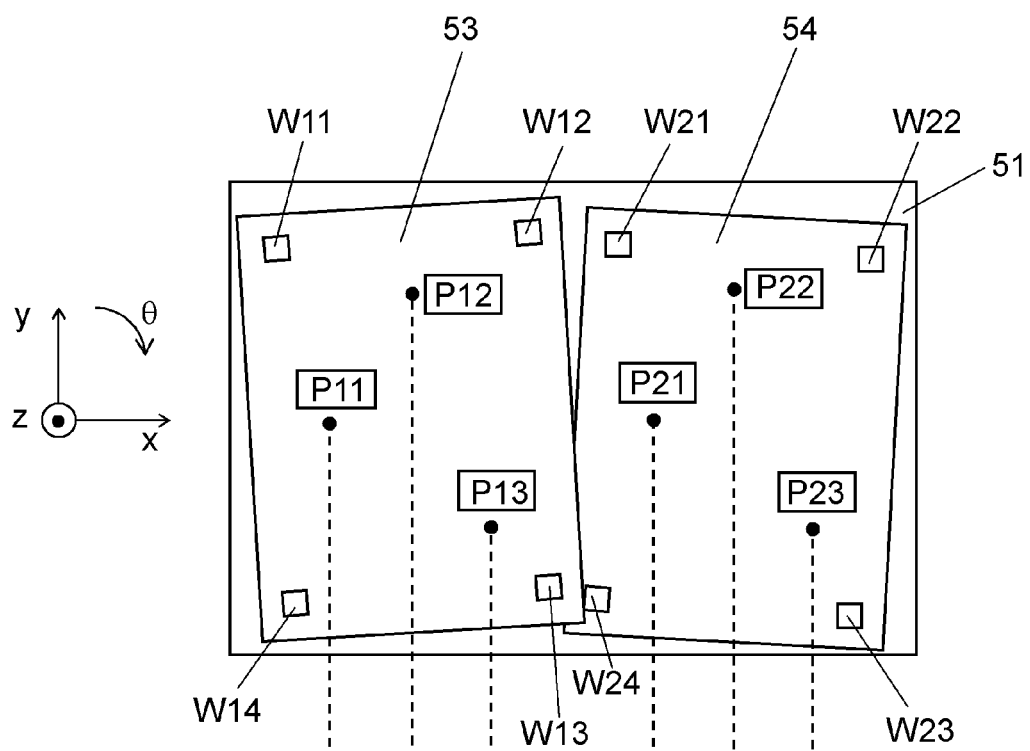
FIG. 6 is a front view showing alignment between photomasks and the substrate in the division exposure.

FIG. 6 shows orthogonal coordinate system x-y. The position correction is to correct positions on x-y axes and rotation direction θ.

As shown in FIG. 6, on four corners of first photomask 53, there are provided windows W11, W12, W13 and W14 through which visible light passes. On four corners of second photomask 54, windows W21, W22, W23 and W24 are provided. An exposure device recognizes the substantially cross-shaped alignment marks (not shown) through windows W11 to W24. Subsequently, first photomask 53 and second photomask 54 are moved so that the alignment marks can be located at predetermined positions. The alignment marks are recognized by such a method of image processing using a camera and the like.

3-2-2. Inclination Correction

Next, the inclination correction for first photomask 53 and second photomask 54 are performed. In the exposure device, at positions thereof opposite to substrate 51 while interposing windows W11 to W24 therebetween, laser displacement meters (not shown) are arranged. Based on reflected light and transmitted light of lasers, the laser displacement meters measure exposure gaps as distances between the photomasks and the substrate. In first photomask 53, at positions P11, P12 and P13 thereof, actuators which are mechanisms for adjusting the exposure gaps are provided. In second photomask 54, the actuators are provided at positions P21, P22 and P23. The actuators are operated by inputting a numeric value to a control mechanism of the exposure device. The exposure gaps are changed by operations of the actuators. Positions P11, P12 and P13 are arranged on different coordinates on orthogonal coordinate system x-y shown in FIG. 6. Hence, a range where it is possible to correct the inclination is increased. The same also applies to positions P21, P22 and P23.

Figure 7:
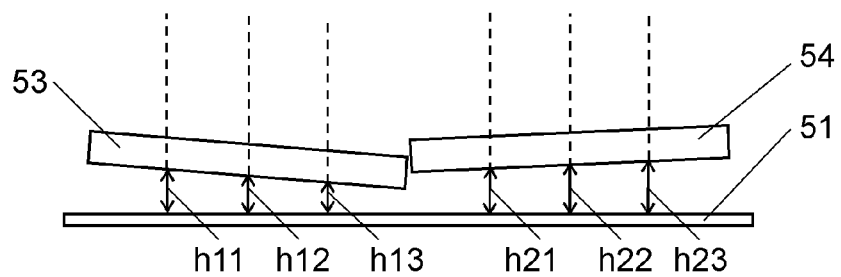
FIG. 7 is a side view showing the alignment between the photomasks and the substrate in the division exposure.

The exposure device according to this embodiment can receive the exposure gaps at six positions. That is, as shown in FIG. 7, the exposure device can receive the exposure gaps in such a way that the exposure gaps at positions P11, P12, P13, P21, P22 and P23 are inputted as heights h11, h12, h13, h21, h22 and h23, respectively.

For example, in the case where the exposure gaps are desired to be set at 500 µm, 500 µm is inputted as heights h11, h12, h13, h21, h22 and h23.

However, actual first photomask 53 and second photomask 54 are not planer. That is, in many cases, each of actual first photomask 53 and second photomask 54 has a curved surface having a warp and a wave. This is because first photomask 53 and second photomask 54 are manufactured from glass substrates larger in area than heretofore.

That is, even if an ideal value of the exposure gaps is inputted to the exposure device, values of the actual exposure gaps sometimes differ therefrom. Hence, it is important to obtain such a setting value of the exposure gaps that ideal exposure gaps can be achieved.

Moreover, in the case of the division exposure, it is important to perform the position correction and the inclination correction for first photomask 53 and second photomask 54 so that a pattern shift in connection region 52c cannot occur. In particular, it is important to equalize the exposure gaps in connection region 52c to each other. That is, in the case where the exposure gaps in connection region 52c are not equal to each other, then in some case, patterns with different widths are formed on both sides of connection region 52c. Therefore, the patterns are not smoothly connected to each other in connection region 52c. Hence, high accuracy is required for the adjustment of the exposure gaps in connection region 52c.

3-2-3. Example

First photomask 53 and second photomask 54 are set on the exposure device. First photomask 53 and second photomask 54 are sucked to a photomask folder (not shown) in the exposure device. A suction surface is provided in a region that does not allow interference from exposure regions. On the respective suction spots, mechanisms which are freely movable in three-dimensional directions with respect to first photomask 53 and second photomask 54 are provided. Therefore, in a state where deflection is intentionally caused in each of first photomask 53 and second photomask 54, first photomask 53 and second photomask 54 can be moved and fixed independently of each other.

In this embodiment, preferably, first photomask 53 and second photomask 54 be fixed so as to become protruding or recessed as a whole with respect to substrate 51 arranged in the exposure device. In such a way, even at the time when the photomasks are replaced, an alignment method to be described later becomes usable.

After the position correction is performed in the above-mentioned procedure, the inclination correction is performed. This example has a feature in a calculation method of the exposure gaps.

First, it is approximated that first photomask 53 is composed of a plurality of polygons. Next, it is assumed that positions P11, P12 and P13 are present on the plurality of polygons. Moreover, heights h11, h12 and h13 are calculated so that the exposure gaps in connection region 52c can become a setting value. Values thus calculated are inputted to the exposure device. Hence, while keeping, to the minimum, such a shift of the exposure gaps in connection region 52c from the setting value, the shift of the exposure gaps can be suppressed to the minimum also in an opposite region with connection region 52c.

The same also applies to second photomask 54.

4. Calculation Example

Figure 8:
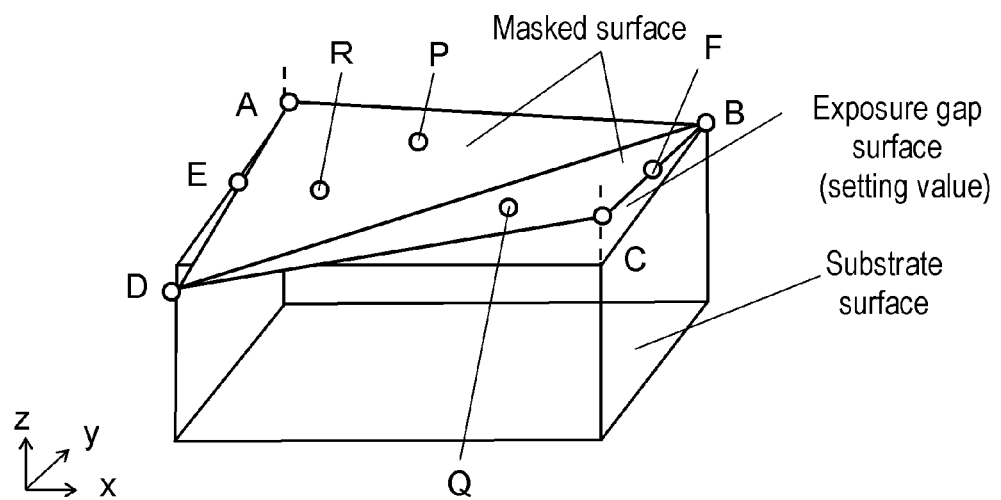
FIG. 8 is a view showing an alignment method for the photomask according to this embodiment.

A specific calculation example is shown. First, FIG. 8 is described in detail. FIG. 8 is a view schematically showing a relationship between substrate 51 and first photomask 53. In FIG. 8, a surface on which substrate 51 is arranged is virtually defined as a substrate surface. A surface at which the setting value of the exposure gap is set with respect to the substrate surface is an exposure gap surface. That is, an upper surface of a cuboid in FIG. 8 is the exposure gap surface. Moreover, first photomask 53 is approximated as triangles as two polygons.

In an x-y-z orthogonal coordinate system of FIG. 8, window W11 shown in FIG. 6 is replaced by $A(A_x, A_y, A_z)$. In a similar way to the above, window W12 is replaced by $B(B_x, B_y, B_z)$. Window W13 is replaced by $C(C_x, C_y, C_z)$. Window W14 is replaced by $D(D_x, D_y, D_z)$. Point P11 is replaced by $P(P_x, P_y, P_z)$. A midpoint of side AD is $E(E_x, E_y, E_z)$. A midpoint of side BC is $F(F_x, F_y, F_z)$. Connection region 52c with second photomask 54 is on a segment BC side. A z-coordinate on the exposure gap surface is $G_z$. That is, $G_z$ is an exposure gap setting value. Moreover, P12 is replaced by $Q(Q_x, Q_y, Q_z)$. P13 is replaced by $R(R_x, R_y, R_z)$. Numeric values to be calculated are $P_z$, $Q_z$ and $R_z$.

Figure 9:
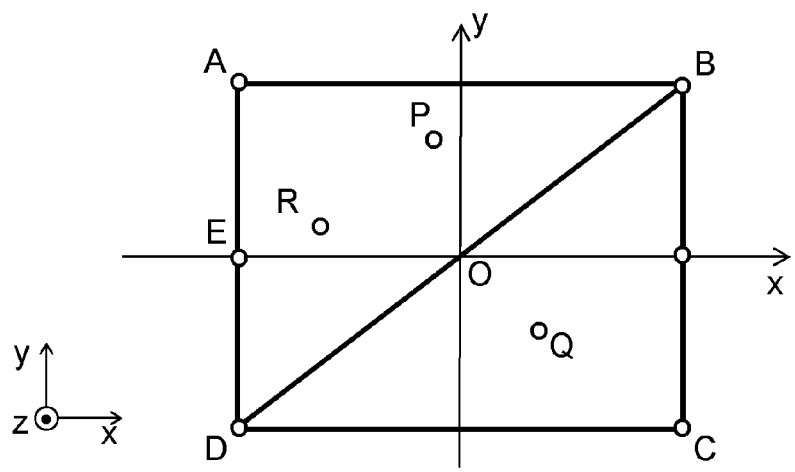
FIG. 9 is a view showing the alignment method for the photomask according to this embodiment.

As shown in FIG. 9, a substrate surface center is defined as an original $O(0, 0, 0)$.

4-1. Calculation of First Rotation Correction Value

First, coordinates of A, B, C and D when the position correction is completed are obtained. Next, first rotation correction value $\Delta Z2$ is calculated.

First, a correction value $\Delta Z1$ when $F_z$ becomes $G_z$ is calculated. That is, $\Delta Z1$ is a correction value when first photomask 53 moves in parallel along the Z-axis. Since F is the midpoint of side BC, $F_z$ is represented as: $F_z = (B_z + C_z)/2$. Therefore, $\Delta Z1$ is represented as: $\Delta Z1 = G_z - (B_z + C_z)/2$.

Next, first rotation correction value $\Delta Z2$ when $B_z$ and $C_z$ become $G_z$ are calculated. That is, $\Delta Z2$ is a correction value when first photomask 53 rotates about, as a center axis, a straight line that passes through F and E. When $B_z$ and $C_z$ become Gz, established are: Bz+ΔZ1+ΔZ2=Gz; and Cz+ΔZ1−ΔZ2=Gz. Therefore, ΔZ2=(Cz−Bz)/2.

4-2. Calculation of Second Rotation Correction Value

It is assumed that the correction by using first rotation correction value ΔZ2 is performed. At this time, z-coordinate Az' of A is represented as: Az'=Az+ΔZ1+ΔZ2=Az+Gz−Bz. z-coordinate Dz' of D is represented as: Dz'=Dz+ΔZ1−ΔZ2=Dz+Gz−Cz.

Next, a second rotation correction value ΔZ3 when Ez becomes Gz is calculated. That is, ΔZ3 is a correction value when first photomask 53 rotates about, as a center axis, a straight line that passes through B and C. When Ez becomes Gz, established is: Ez+ΔZ1+ΔZ3=Gz. Since Ez is represented as: Ez=(Az+Dz)/2, ΔZ3 is represented as: ΔZ3=(−Az+Bz+Cz−Dz)/2.

It is assumed that the correction by using second rotation correction value ΔZ3 is performed. At this time, z-coordinate Az" of A is represented as: Az"=Az'+ΔZ3=Gz+(Az−Bz+Cz−Dz)/2. z-coordinate Dz" of D is represented as: Dz"=Dz'+ΔZ3=Gz+(−Az+Bz−Cz+Dz)/2. Moreover, Bz and Cz at this time are left as Gz.

That is, in this example, a distance between midpoint F of first side BC and substrate 51 is matched with exposure gap Gz. Next, first photomask 53 is rotated about, as an axis, a line that connects midpoint F and midpoint E of second side AD to each other, whereby distances between respective points B and C and substrate 51 are matched with exposure gap Gz. Next, first photomask 53 is rotated about a BC axis, whereby a distance between midpoint E and substrate 51 is matched with exposure gap Gz.

By the above-described operations, there are obtained coordinates A, B, C and D when it is assumed that the region of first photomask 53, which corresponds to connection region 52c, is matched with the exposure gap setting value, and that the region opposite to connection region 52c is approximated to the exposure gap setting value as much as possible. Note that, strictly, x and y coordinates of points A, B, C and D also move at the time of rotating first photomask 53. However, a movement amount of the photomask in the z-direction is smaller by approximately two digits than those in the directions of the x and y axes, and accordingly, the moving amounts in the x and y directions can be ignored.

4-3. Calculation of Input Value

Next, coordinates Pz, Qz and Rz are calculated. Coordinates Px, Py, Qx, Qy Rx and Ry are already determined at the point of time when the position correction is performed. In this example, a configuration is adopted so that all of points P, Q and R cannot be located in triangle BCD or triangle ABD. That is, any of points P, Q and R is located in triangle BCD. In addition, any of points P, Q and R is located in triangle ABD. As an example, as shown in FIG. 8 and FIG. 9, points P and R are located in triangle ABD, and point Q is located in triangle BCD.

4-3-1. Calculation of Pz

When a vector that connects points A and D to each other is S, and a vector that connects points A and B to each other is T, vector S is represented as: S=(Dx−Ax, Dy−Ay, Dz−Az), and vector T is represented as: T=(Bx−Ax, By−Ay, Bz−Az).

When vector U normal to vector S and vector T is obtained, U is represented as: U={(Dy−Ay)(Bz−Az)−(By−Ay)(Dz−Az), (Dz−Az)(Bx−Ax)−(Bz−Az)(Dx−Ax), (Dx−Ax)(By−Ay)−(Bx−Ax)(Dy−Ay)}.

Hence, by using a constant k, a plane, which contains triangle ABD and is normal to vector U, can be represented as: {(Dy−Ay)(Bz−Az)−(By−Ay)(Dz−Az)}X+{(Dz−Az)(Bx−Ax)−(Bz−Az)(Dx−Ax)}Y+{(Dx−Ax)(By−Ay)−(Bx−Ax)(Dy−Ay)}Z+k=0.

Triangle ABD passes through point D. Accordingly, obtained constant k is represented as: k={(Dy−Ay)(Bz−Az)−(By−Ay)(Dz−Az)}Dx+{(Dz−Az)(Bx−Ax)−(Bz−Az)(Dx−Ax)}Dy+{(Dx−Ax)(By−Ay)−(Bx−Ax)(Dy−Ay)}Dz, and a plane made by triangle ABD is obtained.

Point P is a point on triangle ABD, and accordingly, coordinate Pz can be calculated by using the above-described expression and already determined coordinates Px and Py. The same also applies to point R.

In a similar way, also with regard to triangle BCD, by using a constant h, such a plane can be represented as: {(By−Cy)(Dz−Cz)−(Dy−Cy)(Bz−Cz)}X+{(Bz−Cz)(Dx−Cx)−(Dz−Cz)(Bx−Cx)}Y+{(Bx−Cx)(Dy−Cy)−(Dx−Cx)(By−Cy)}Z+h=0.

Here, constant h is represented as: h={(By−Cy)(Dz−Cz)−(Dy−Cy)(Bz−Cz)}Dx+{(Bz−Cz)(Dx−Cx)−(Dz−Cz)(Bx−Cx)}Dy+{(Bx−Cx)(Dy−Cy)−(Dx−Cx)(By−Cy)}Dz=0.

Then, point Q is a point on triangle BCD, and accordingly, coordinate Qz can be calculated by using the above-described expression and already determined coordinates Qx and Qy.

By the above-described calculations, points P, Q and R can be obtained from the coordinates of points A, B, C and D. Note that, as the coordinates of points A, B, C and D, the coordinates calculated in the inclination correction of the above-described photomasks are used. In other words, there are obtained coordinates Pz, Qz and Rz for moving first photomask 53 to the coordinates of positions A, B, C and D therein when the shift from the exposure gap is suppressed to the minimum in the region opposite to connection region 52c while keeping the shift of connection region 52c from the setting value of the exposure gap to the minimum. The calculated coordinates Pz, Qz and Rz are inputted to the exposure device, whereby the inclination correction is implemented. Similar correction is implemented also for second photomask 54.

In this example, the correction values are calculated by approximating that first photomask 53 and second photomask 54 are composed of two triangles. However, in actual, there is a case where first photomask 53 and second photomask 54 are not necessarily composed of two triangles. Therefore, the exposure gaps after the inclination correction are measured, whereby differences thereof from the setting value are obtained. The correction values are calculated one more time after reflecting the differences thereon, whereby the correction values can be made more approximate to the setting value of the exposure gap.

Note that, in the exposure device according to this embodiment, a mechanism for setting the exposure gap is not provided in each of windows W11 to W24. This is because it is made possible to manufacture a variety of PDPs with different screen sizes by the same exposure device. That is, the inclination correction for the photomask can be performed not at four corners of the photomask, but at three points of a common region corresponding to various types. In such a way, a time loss in switching types in the manufacturing process is reduced.

5. Conclusion

In the method for manufacturing the FPD in this embodiment, photosensitive material layer 52 as the photosensitive film formed on substrate 51 is subjected to the division exposure by using the plurality of photomasks arranged above the same while interposing exposure gap Gz therebetween. The plurality of photomasks at least includes first photomask 53 and second photomask 54. First photomask 53 is rectangular, and includes the first side and the second side opposite to the first side. Second photomask 54 is rectangular, and includes the third side and the fourth side opposite to the third side.

First, in connection region 52c as a boundary portion to be subjected to the division exposure, the distance between the midpoint of the first side and substrate 51 is matched with exposure gap Gz. Next, first photomask 53 is rotated about, as the axis, the line that connects the midpoint of the first side and the midpoint of the second side to each other, whereby the distances between both ends of the first side and substrate 51 are individually matched with exposure gap Gz. Next, first photomask 53 is rotated about the first side taken as the axis, whereby the distance between the second side and substrate 51 is matched with exposure gap Gz.

Subsequently, in connection region 52c, the distance between the midpoint of the third side and substrate 51 is matched with exposure gap Gz. Next, second photomask 54 is rotated about, as the axis, the line that connects the midpoint of the third side and the midpoint of the fourth side to each other, whereby the distances between both ends of the third side and substrate 51 are individually matched with exposure gap Gz. Next, second photomask 54 is rotated about the third side taken as the axis, whereby the distance between the midpoint of the fourth side and substrate 51 is matched with exposure gap Gz.

In accordance with the above-described method, the shift from exposure gap Gz can be suppressed to the minimum in the region opposite to connection region 52c while keeping the shift of connection region 52c from exposure gap Gz to the minimum.

Note that, in this embodiment, it is approximated that first photomask 53 and second photomask 54 are composed of two triangles. However, the present invention is not limited to this. It may be approximated that first photomask 53 and second photomask 54 are composed of other polygons as appropriate as well as the triangles. Moreover, it can also be approximated that first photomask 53 and second photomask 54 are composed of three or more triangles.

Moreover, in this embodiment, the illustration has been made of the division exposure in which the region to be exposed is divided into two. However, the present invention is not limited to this. A similar method is also applicable to division exposure in which the region to be exposed is divided into three or more.

INDUSTRIAL APPLICABILITY

As described above, the technology described herein is widely useful for the manufacture of the FPD, in which the pattern forming is performed by the lithography.

REFERENCE MARKS IN THE DRAWINGS

1 PDP
2 front plate
3 front glass substrate
4 scan electrode
5 sustain electrode
6 display electrode
7 black stripe (light shielding layer)
8 dielectric layer
9 protective layer
10 rear plate
11 rear glass substrate
12 data electrode
13 base dielectric layer
14 barrier rib
15 phosphor layer
51 substrate
52 photosensitive material layer
52a first exposure region
52b second exposure region
52c connection region
53 first photomask
54 second photomask
55 opening portion
81 first dielectric layer
82 second dielectric layer

The invention claimed is:

1. An alignment method in which a distance between a substrate and a photo-mask is set at a predetermined exposure gap, wherein the photomask is rectangular and includes a first side and a second side opposite to the first side, the method comprising:
matching a distance between a midpoint of the first side and the substrate with the exposure gap;
rotating the photomask about, as an axis, a line that connects the midpoint of the first side and a midpoint of the second side to each other, thereby matching distances between both ends of the first side and the substrate individually with the exposure gap; and
rotating the photomask about the first side taken as an axis, thereby matching a distance between the midpoint of the second side and the substrate with the exposure gap.

2. The alignment method according to claim 1, further comprising:
approximating that the photomask is composed of at least two polygons; and
controlling positions of at least one point in a first polygon and of at least one point in a second polygon, thereby matching, with the exposure gap, the distances from the substrate to the midpoint of the first side, to both ends of the first side and to the midpoint of the second side.

3. The alignment method according to claim 2, further comprising:
fixing the photomask in either of a projection shape and a recess shape with respect to the substrate; and
approximating that the photomask is composed of at least two polygons.

4. The alignment method according to claim 2, wherein the photomask is approximated to be composed of two triangles.

5. The alignment method according to claim 3, wherein the photomask is approximated to be composed of two triangles.

6. A method for producing a flat panel display, in which a photosensitive film formed on a substrate is subjected to division exposure by using a plurality of photomasks disposed above the photosensitive film while interposing an exposure gap therebetween, wherein the plurality of photomasks at least include a first photomask and a second photomask, the method comprising:
providing the first photomask that is rectangular, and includes a first side, and a second side opposite to the first side;
providing the second photomask that is rectangular, and includes a third side, and a fourth side opposite to the third side;
matching a distance between a midpoint of the first side and the substrate with the exposure gap in a boundary portion subjected to the division exposure;
rotating the first photomask about, as an axis, a line that connects the midpoint of the first side and a midpoint of the second side to each other, thereby matching distances between both ends of the first side and the substrate individually with the exposure gap;

rotating the first photomask about the first side taken as an axis, thereby matching a distance between the midpoint of the second side and the substrate with the exposure gap;

matching a distance between a midpoint of the third side and the substrate with the exposure gap in a boundary portion subjected to the division exposure;

rotating the second photomask about, as an axis, a line that connects the midpoint of the third side and a midpoint of the fourth side to each other, thereby matching distances between both ends of the third side and the substrate individually with the exposure gap; and rotating the second photomask about the third side taken as an axis, thereby matching a distance between the midpoint of the fourth side and the substrate with the exposure gap.

* * * * *